(12) United States Patent
Wu et al.

(10) Patent No.: US 8,675,418 B2
(45) Date of Patent: Mar. 18, 2014

(54) MEMORY WRITE ASSIST

(75) Inventors: Jui-Jen Wu, Hsinchu (TW); Shau-Wei Lu, Taoyuan (TW); Robert Lo, Shin-Chu (TW); Kun-Hsi Li, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 373 days.

(21) Appl. No.: 12/872,135

(22) Filed: Aug. 31, 2010

(65) Prior Publication Data
US 2012/0051151 A1    Mar. 1, 2012

(51) Int. Cl.
*G11C 7/10* (2006.01)

(52) U.S. Cl.
USPC ........... 365/189.04; 365/185.13; 365/185.25; 365/189.07; 365/189.12; 365/189.11; 365/230.05

(58) Field of Classification Search
USPC ............ 365/189.04, 185.13, 185.25, 189.07, 365/230.03, 230.05, 189.12, 189.11, 185.12
See application file for complete search history.

(56) References Cited

U.S. PATENT DOCUMENTS

| 4,802,122 A * | 1/1989 | Auvinen et al. ............... 365/154 |
| 5,862,092 A * | 1/1999 | Hawkins et al. ............... 365/221 |
| 5,995,433 A * | 11/1999 | Liao ............................... 365/222 |
| 6,445,634 B2 * | 9/2002 | Yoshioka ....................... 365/221 |
| 7,436,689 B2 * | 10/2008 | Fukushi .......................... 365/65 |
| 7,577,037 B2 * | 8/2009 | Li et al. ..................... 365/185.22 |
| 8,462,542 B2 * | 6/2013 | Deng ............................. 365/156 |
| 8,514,612 B2 * | 8/2013 | Ishii et al. ..................... 365/154 |

* cited by examiner

*Primary Examiner* — Pho M Luu
(74) *Attorney, Agent, or Firm* — Lowe Hauptman & Ham, LLP

(57) ABSTRACT

A memory includes a memory cell, two word lines coupled to the memory cell, two bit lines coupled to the memory cell, and a write assist cell. The write assist cell is configured to transfer data of one bit line in a write operation to the other bit line in a read operation when one word line is used for the write operation, the other word line is used for the read operation, and the two word lines are asserted simultaneously.

20 Claims, 4 Drawing Sheets

MEMORY WRITE ASSIST

TECHNICAL FIELD

The present disclosure relates generally to an integrated circuit, and more particularly to a memory.

BACKGROUND

A conventional two-port memory faces a critical VDDmin (minimum operable power supply voltage) issue when one port is in a write operation and another port is in a read operation simultaneously. In some circuits, the write operation fails when there is a timing skew on the word lines, such that there is a time overlap between a write word line (A-port) and a read word line (B-port) that is asserted after the write word line is asserted. When both word lines are asserted simultaneously, the write data is disturbed by the read word line that is precharged. The VDDmin of the memory is also limited by the simultaneous A-port write and B-port read access at the same row by two word lines.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
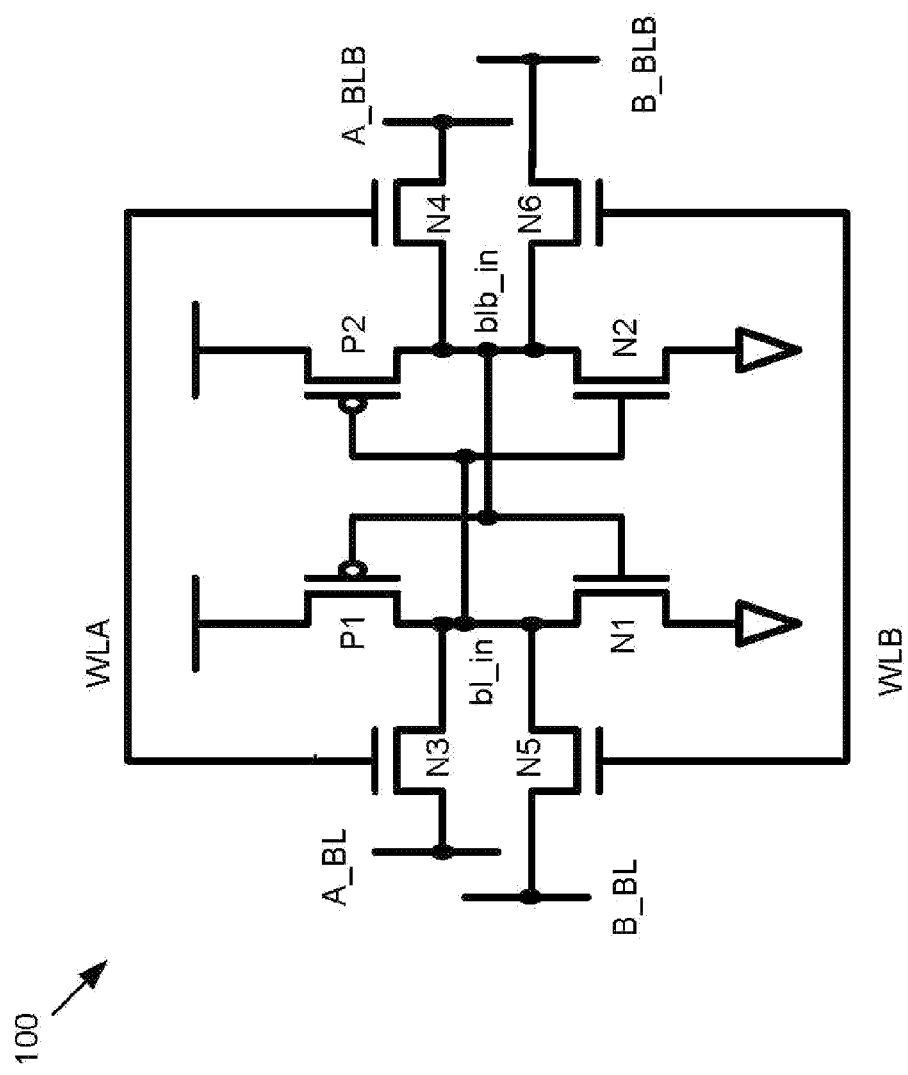
FIG. 1 is a schematic diagram showing an exemplary dual port memory cell upon which a write assist circuit can be used according to some embodiments.

FIG. 1 is a schematic diagram showing an exemplary dual port memory cell upon which a write assist circuit can be used according to some embodiments. PMOS transistors P1 and P2 and NMOS transistors N1 and N2 hold data in the memory cell 100. NMOS transistors N3, N4, N5, and N6 are used for access to the memory cell 100 for two ports A and B, through A bit line (A_BL), A bit line bar (A_BLB), B bit line (B_BL), and B bit line bar (B_BLB). Two word lines WLA and WLB are coupled to the gates of NMOS transistors N3, N4, N5, and N6 to control access.

Figure 2:
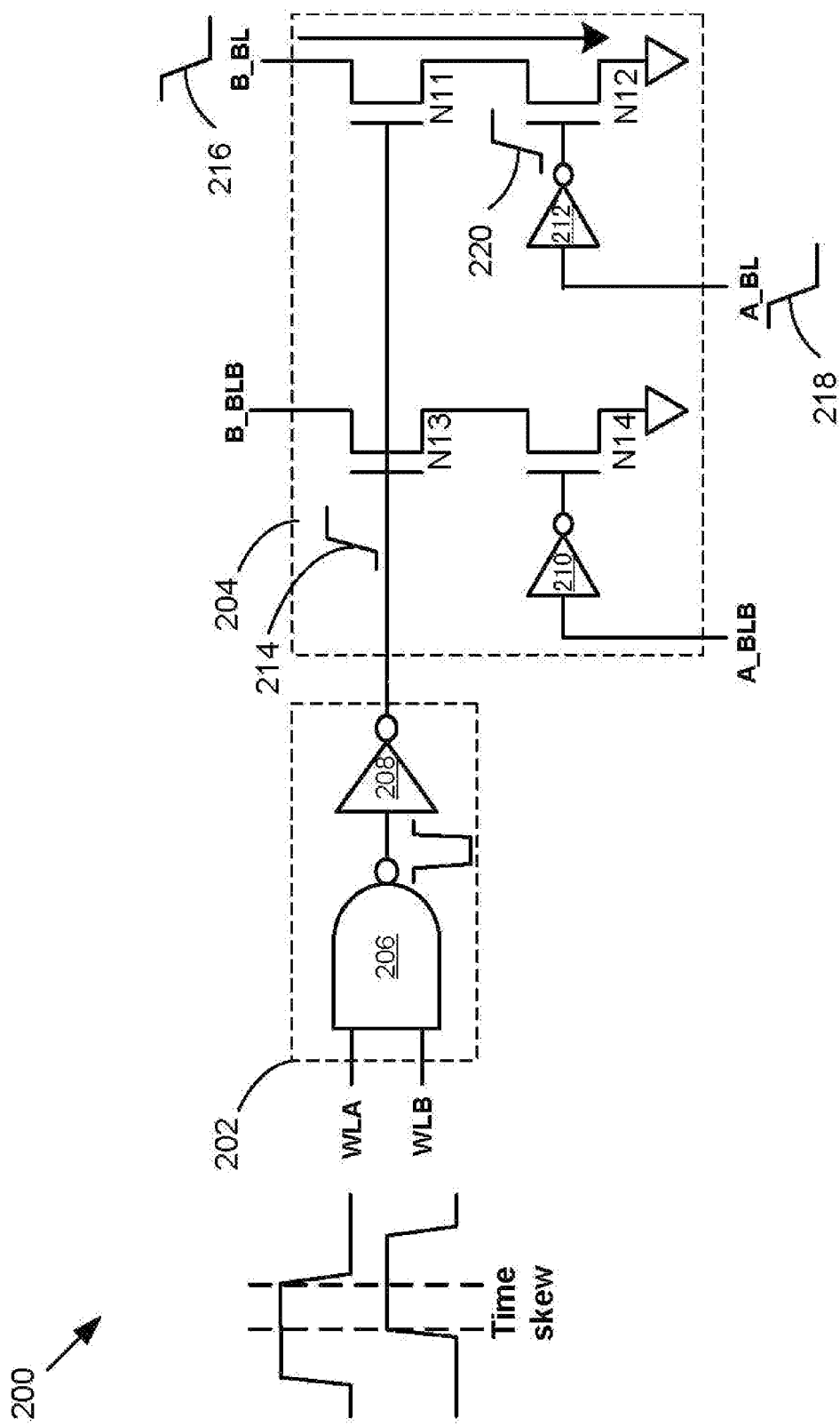
FIG. 2 is a schematic diagram showing an exemplary write assist circuit according to some embodiments.

FIG. 2 is a schematic diagram showing an exemplary write assist circuit 200 according to some embodiments. The write assist circuit 200 shows a word line detection circuit 202 and a write assist cell 204. The word line detection circuit 202 has a NAND gate 206 coupled to an inverter 208. The NAND gate 206 has the two word line signals WLA and WLB, and a Hit signal as its inputs.

The Hit signal is asserted (logical 1) if the A-port row address and the B-port row address are the same. Thus, the write assist cell can be enabled when the two-port row address are the same (i.e., accessing the same row). It is because the write disturb issue occurs when the two ports access the same row. The write assist cell 204 has eight transistors, i.e., six NMOS transistors N11, N12, N13, N14, and two in inverters 210 and 212, and two PMOS transistors in inverters 210 and 212. Other embodiments may have different numbers of transistors.

The signal 214 from the word line detection circuit 202 is a logical 1 when both WLA and WLB have a logical 1. For example, this happens when there is a small timing skew on the WLB that is asserted for a read operation (through B_BL) after WLA is asserted for a write operation (through A_BL), which results in a time overlap of both word lines being asserted simultaneously.

When the signal 214 is a logical 1, NMOS transistors N11 and N13 are turned on. Assuming bit line A (A_BL) is in a write 0 operation and becomes a logical 0 as the signal 218 shows, the inverter 212's output becomes a logical 1 as the signal 220 shows, and turns on the NMOS transistor N12 and pulls down bit line B (B_BL) coupled to the series of NMOS transistors N11 and N12 to a logical 0. Therefore, instead of disturbing the write data of one port in a write operation, i.e., a logical 0 on A_BL, by another port's read operation, i.e., B_BL, the write data of one bit line, i.e., a logical 0 of A_BL, is transferred to the other bit line, i.e., B_BL.

If A_BL is in a write 1 operation and becomes a logical 1, then the inverter 212's output becomes a logical 0 to turn off N12, thus B_BL is not pulled down and stays a logical 1 after precharging for B_BL's read operation. A_BLB and B_BLB's operation is similar to A_BL and B_BL as explained above, except that A_BLB has the opposite logical value of A_BL and B_BLB has the opposite logical value of B_BL.

The write assist cell 204 drives the write data of A-port (e.g., A_BL) to B-port (e.g., B_BL) to improve the write margin of the memory whenever a read-disturb-write occurs. The write assist cell 204 improves (lowers) VDDmin by reducing a write operation disturbance caused by a simultaneous read operation. For example, the VDDmin in a memory without the write assist cell 204 was about 1 V, while the VDDmin in the memory with the write assist cell 204 was about 0.93 V in one embodiment. In another embodiment, as the size (e.g., width) of NMOS transistors N11, N12, N13, and N14 was increased, the VDDmin was further reduced.

Figure 3:
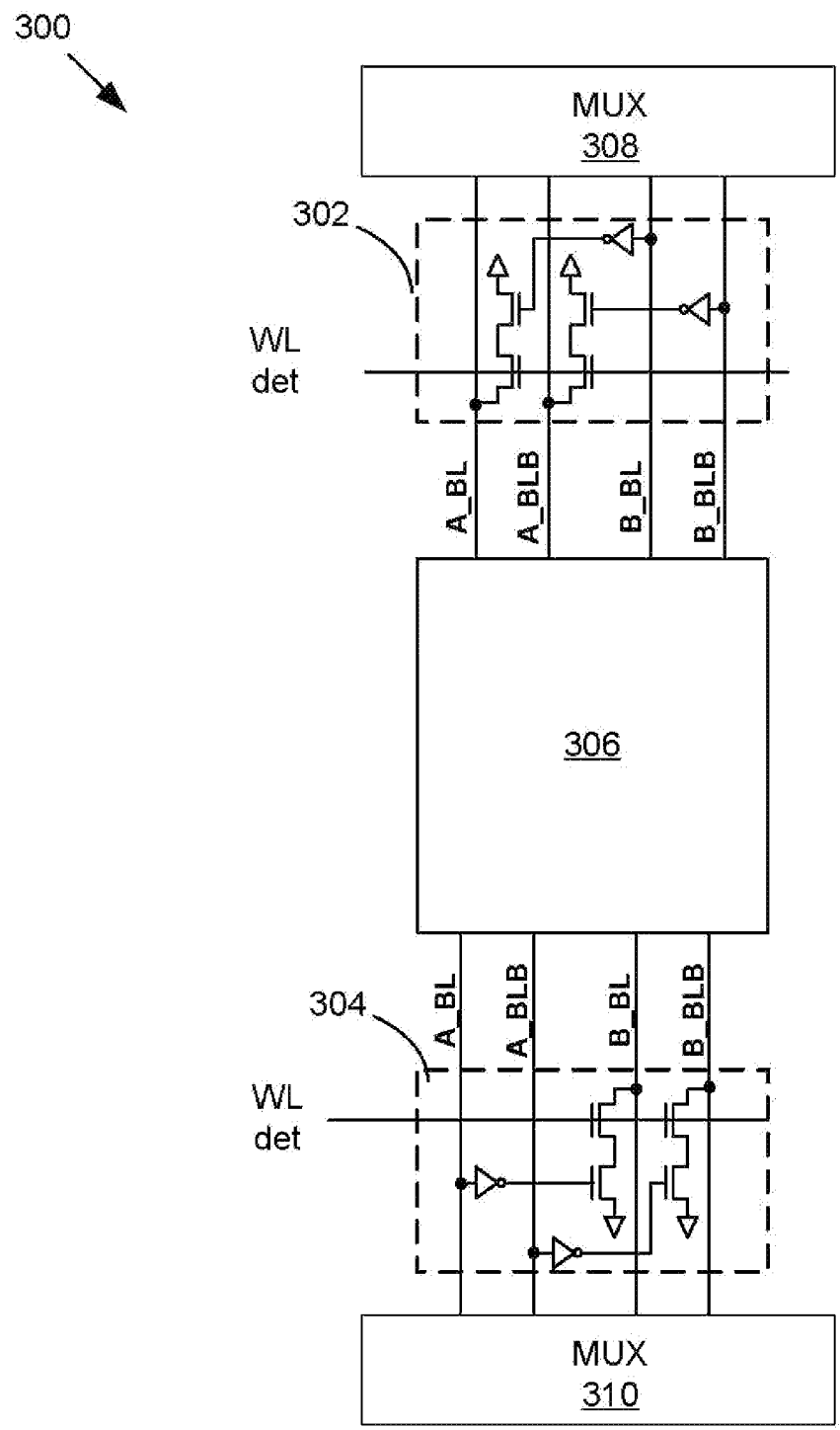
FIG. 3 is a schematic diagram showing an exemplary layout placement for the write assist circuit in FIG. 2 according to some embodiments.

FIG. 3 is a schematic diagram showing an exemplary layout placement for the write assist circuit in FIG. 2 according to some embodiments. The write assist cells 302 and 304 are connected to the memory array 306 with bit lines A_BL and B_BL, and bit line bars A_BLB and B_BLB. Multiplexers (MUX) 308 and 310 couple bit line signals and bit line bar signals when memory array 306 is accessed.

Word line detection signals (WL det), which indicate detection of when two word lines (e.g., WLA and WLB) connected to a common row (e.g., when Hit signal is asserted) of the memory array 306 are asserted simultaneously, are coupled to the write assist cells 302 and 304. The write assist cell 302 reduces writing disturbance when writing on B_BL (or B_BLB) and reading on A_BL (or A_BLB). The write assist cell 304 reduces writing disturbance when writing on A_BL (or A_BLB) and reading on B_BL (or B_BLB).

The write assist cells 302 and 304 are placed in the column edge of the two bit lines, i.e., A_BL and B_BL, and bit lines bars, i.e., A_BLB and B_BLB (A-port and B-port). The VDDmin of the memory 300 is lower than conventional circuits without the write assist cells 302 and 304, but there is no significant area penalty because the write assist cells 302 and 304 are shared by memory cells in the memory array 306 having common bit lines and bit line bars in the same column.

The write assist cells 302 and 304 can be also designed as part of dummy edge cells in a memory layout to incur less than a 1% area penalty.

Figure 4:
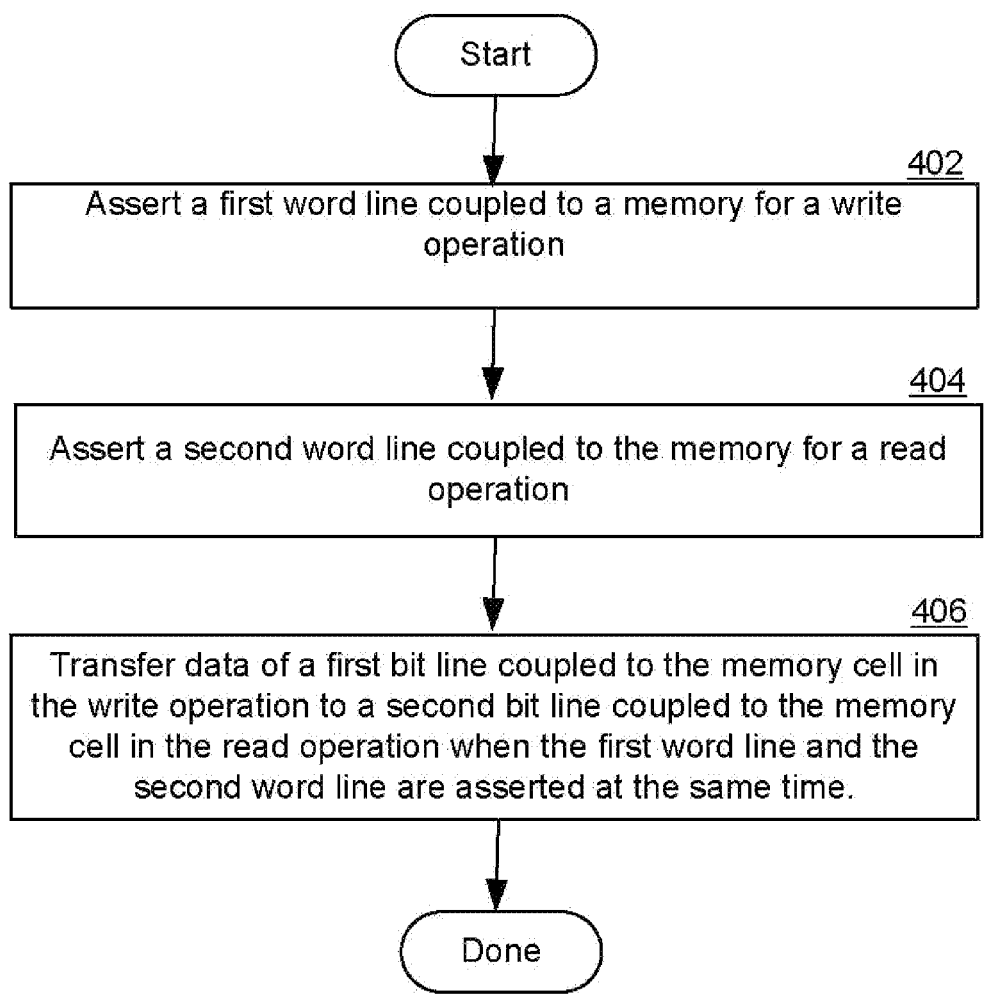
FIG. 4 is a flowchart of a method for the write assist circuit in FIG. 2 according to some embodiments.

FIG. 4 is a flowchart of a method for the write assist circuit in FIG. 2 according to some embodiments. At step 402, a first word line, e.g., WLA, coupled to a memory, is asserted for a write operation, e.g., a write 0 operation. At step 404, a second word line, e.g., WLB, coupled to the memory, is asserted for a read operation. At step 406, the data of a first bit line, e.g., A_BL, coupled to the memory cell in the write operation, e.g., a write 0 operation, is transferred to the second bit line, e.g., B_BL, coupled to the memory cell in the read operation when the first word line, e.g., WLA, and the second word line, e.g., WLB, are asserted simultaneously.

In some embodiments, the transferring data of the first bit line, e.g., A_BL, comprises pulling down the second bit line, e.g., B_BL, when the first bit line, e.g., A_BL, has a logical 0. Also, the pulling down the second bit line, e.g., B_BL, can include turning on a first NMOS transistor, e.g., N12, coupled to the second bit line, e.g., B_BL, using an inverter, e.g., 212, coupled to the first bit line, e.g., A_BL.

In some embodiments, the method can further include transferring data of a first bit line bar, e.g., A_BLB, coupled to the memory cell in the write operation to a second bit line bar, e.g., B_BLB, coupled to the memory cell in the read operation when the first word line, e.g., WLA, and the second word line, WLB, are asserted simultaneously.

In some embodiments, the transferring data of the first bit line bar, e.g., A_BLB, comprises pulling down the second bit line bar, e.g., B_BLB, when the first bit line bar, e.g., A_BLB, has a logical 0. The pulling down the second bit line bar, B_BLB, can include turning on a first NMOS transistor, e.g., N14, coupled to the second bit line bar, e.g., B_BLB, using an inverter, e.g., 210, coupled to the first bit line bar, e.g., A_BLB.

In some embodiments, the method can further include detecting when the first word line, e.g., WLA, and the second word line, e.g., WLB, are asserted simultaneously. The detecting can include coupling the first word line, e.g., WLA, and the second word line, e.g., WLB, to a NAND gate, e.g., 206, to generate a control signal. The method can further include sending the control signal to a write assist cell, e.g., 204, to initiate the transferring data of a first bit line, e.g., A_BL.

In some embodiments, a memory includes a memory cell, two word lines coupled to the memory cell, two bit lines coupled to the memory cell, and a write assist cell. The write assist cell is configured to transfer data of one bit line in a write operation to the other bit line in a read operation when one word line is used for the write operation, the other word line is used for the read operation, and the two word lines are asserted simultaneously.

In some embodiments, a method for a memory includes asserting a first word line coupled to a memory for a write operation. A second word line coupled to the memory for a read operation is asserted. The data of a first bit line coupled to the memory cell in the write operation is transferred to the second bit line coupled to the memory cell in the read operation when the first word line and the second word line are asserted simultaneously.

A skilled person in the art will appreciate that there can be many variations to the embodiments of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory, comprising:
    a memory cell;
    a first word line coupled to the memory cell;
    a second word line coupled to the memory cell;
    a first bit line coupled to the memory cell;
    a second bit line coupled to the memory cell; and
    a write assist cell comprising a first pull-down circuit, wherein the first pull-down circuit comprises a transistor having a terminal coupled to a ground,
    wherein the write assist cell is configured to transfer data of the first bit line in a write operation to the second bit line in a read operation when the first word line is utilized for the write operation, the second word line is utilized for the read operation, and the first word line and the second word line are asserted simultaneously.

2. The memory of claim 1, wherein the write assist cell comprises a second pull-down circuit coupled to the second bit line.

3. The memory of claim 2, further comprising a first bit line bar coupled to the memory, wherein the second pull-down circuit comprises a first NMOS transistor and an inverter, the first bit line bar is coupled to the inverter, the inverter is coupled to a gate of the first NMOS transistor, and a source of the first NMOS transistor is coupled to a ground.

4. The memory of claim 3, further comprising a second bit line bar, wherein the second pull-down circuit further comprises a second NMOS transistor, a source of the second NMOS transistor is coupled to a drain of the first NMOS transistor, and a drain of the second NMOS transistor is coupled to the second bit line bar.

5. The memory of claim 1, wherein the first pull-down circuit comprises a first NMOS transistor and an inverter, wherein the first bit line is coupled to the inverter, the inverter is coupled to a gate of the first NMOS transistor, and a source of the first NMOS transistor is coupled to the ground.

6. The memory of claim 5, wherein the first pull-down circuit further comprises a second NMOS transistor, wherein a source of the second NMOS transistor is coupled to a drain of the first NMOS transistor, and a source of the second NMOS transistor is coupled to the second bit line.

7. The memory of claim 1, further comprising a word line detection circuit that detects when the first word line and the second word line are asserted simultaneously to send a control signal to the write assist cell.

8. The memory of claim 7, wherein the word line detection circuit comprises a NAND gate and an inverter, and the first word line and the second word line are coupled to the NAND gate.

9. A method comprising:
asserting a first word line coupled to a memory cell for a write operation;
asserting a second word line coupled to the memory cell for a read operation;
transferring data of a first bit line coupled to the memory cell in the write operation to a second bit line coupled to the memory cell in the read operation when the first word line and the second word line are asserted simultaneously, wherein transferring the data of the first bit line comprises selectively connecting the second bit line to ground without connecting the first bit line to the second bit line.

10. The method of claim 9, wherein the transferring data of the first bit line comprises pulling down the second bit line when the first bit line has a logical 0.

11. The method of claim 10, wherein the pulling down the second bit line comprises turning on a first NMOS transistor coupled to the second bit line utilizing an inverter coupled to the first bit line.

12. The method of claim 9 further comprising transferring data of a first bit line bar coupled to the memory cell in the write operation to a second bit line bar coupled to the memory cell in the read operation when the first word line and the second word line are asserted simultaneously.

13. The method of claim 12, wherein the transferring data of the first bit line bar comprises pulling down the second bit line bar when the first bit line bar has a logical 0.

14. The method of claim 13, wherein the pulling down the second bit line bar comprises turning on a first NMOS transistor coupled to the second bit line bar utilizing an inverter coupled to the first bit line bar.

15. The method of claim 9, further comprising detecting when the first word line and the second word line are asserted simultaneously.

16. The method of claim 15, wherein the detecting comprises coupling the first word line and the second word line to a NAND gate to generate a control signal.

17. The method of claim 15, further comprising sending a control signal to a write assist cell to initiate the transferring data of a first bit line.

18. A memory, comprising:
a memory cell;
a first word line coupled to the memory cell;
a second word line coupled to the memory cell;
a first bit line coupled to the memory cell;
a second bit line coupled to the memory cell;
a write assist cell; and
a word line detection circuit that detects when the first word line and the second word line are asserted simultaneously to send a control signal to the write assist cell,
wherein the write assist cell comprises a first pull-down circuit coupled to the first bit line and a second pull-down circuit coupled to the second bit line, the first pull-down circuit comprises a first NMOS transistor, and the first bit line is coupled to an inverter and the inverter is coupled to a gate of the first NMOS transistor, and the write assist cell is configured to transfer data of the first bit line in a write operation to the second bit line in a read operation when the first word line is used for the write operation, the second word line is used for the read operation, and the first word line and the second word line are asserted simultaneously.

19. The memory of claim 18, wherein the first pull-down circuit further comprises a second NMOS transistor, wherein a source of the first NMOS transistor is coupled to a ground, a source of the second NMOS transistor is coupled to a drain of the first NMOS transistor, and a source of the second NMOS transistor is coupled to the second bit line.

20. The memory of claim 18, wherein the word line detection circuit comprises a NAND gate and an inverter, and wherein the first word line and the second word line are coupled to the NAND gate.

* * * * *